United States Patent [19]

Yetter

[11] Patent Number: 5,208,490

[45] Date of Patent: May 4, 1993

[54] FUNCTIONALLY COMPLETE FAMILY OF SELF-TIMED DYNAMIC LOGIC CIRCUITS

[75] Inventor: Jeffry D. Yetter, Ft. Collins, Colo.

[73] Assignee: Hewlett-Packard Company, Palo Alto, Calif.

[21] Appl. No.: 684,720

[22] Filed: Apr. 12, 1991

[51] Int. Cl.⁵ .............................................. H03K 19/017
[52] U.S. Cl. ..................................... 307/452; 307/443
[58] Field of Search ................. 307/443, 472, 451–453

[56] References Cited

U.S. PATENT DOCUMENTS

| | | | |
|---|---|---|---|
| 4,468,575 | 8/1984 | Mathes | 307/453 X |
| 4,569,032 | 2/1986 | Lee | 307/452 x |
| 4,570,084 | 2/1986 | Griffin et al. | 307/452 |
| 4,682,055 | 7/1987 | Upadhyayula | 307/451 |
| 4,692,637 | 9/1987 | Shoji | 307/443 |
| 4,700,086 | 10/1987 | Ling et al. | 307/452 X |
| 4,730,266 | 3/1988 | van Meerbergen et al. | 307/472 X |
| 4,827,160 | 5/1989 | Okano | 307/452 X |
| 4,841,174 | 6/1989 | Chung et al. | 307/452 X |
| 4,899,066 | 2/1990 | Aikawa et al. | 307/452 |
| 5,015,882 | 5/1991 | Houston et al. | 307/452 |

OTHER PUBLICATIONS

Weste and Eshraghian, *Principles of CMOS VLSI Design*, § 5.2.5–5.2.7, pp. 168–171.

Mead and Conway, *Introduction to VLSI Systems*, § 7.6–7.8.6, pp. 242–261.

Primary Examiner—David R. Hudspeth
Attorney, Agent, or Firm—Guy J. Kelley

[57] ABSTRACT

A logic system uses novel mousetrap logic gates which implement novel vector logic. In a vector logic system, any number of valid vector logic states and one invalid vector logic state is defined by the logic signals on a set of logic paths. An invalid vector logic state is defined as the case when all logic paths exhibit a low logic signal. A valid vector logic state can be defined in a variety of ways. In the preferred embodiment, a valid vector logic state is defined as the case when one and only one of said logic paths exhibits a high logic signal. Furthermore, mousetrap logic gates, which can be connected directly in series and/or parallel to collectively perform logic functions, implement the foregoing logic scheme. Each mousetrap logic gate has an arming mechanism, ladder logic, and a buffer. A precharge is supplied by the arming mechanism to the buffer. Incoming logic is operated upon by the ladder logic and used to trigger the precharged buffer. Each of the mousetrap gates is self-timed so that no output exists until all necessary valid inputs are present.

27 Claims, 6 Drawing Sheets

FUNCTIONALLY COMPLETE FAMILY OF SELF-TIMED DYNAMIC LOGIC CIRCUITS

BACKGROUND OF THE INVENTION

I. Field of the Invention

The present invention relates generally to data processing units and, more particularly, to a functionally complete family of self-timed logic gates.

II. Related Art

As computers are becoming significantly more powerful and substantially minimized in size, the line of demarcation which has historically existed between mainframe computers, minicomputers, and microcomputers has been blurred. Present day minicomputers and microcomputers are as powerful as the mainframe computers of a decade ago. Moreover, the foregoing trend has resulted in an industry-wide demand for computer components which exhibit high performance and occupy less of a computer's valuable real estate.

A major computer component getting much of the attention in the industry is the central processing unit (CPU), which is the primary source of intelligence in a computer. The CPU must be designed to be extremely fast because it generally handles and ultimately supervises most of the interactions which occur within the computer.

The CPU usually has an arithmetic logic unit (ALU) for performing mathematical operations, such as addition, multiplication, and floating point manipulations. Typically, these mathematical operations are implemented via dedicated logic circuits within the CPU. These dedicated logic circuits must be fast, due to their frequent usage, so as not to undesirably slow the overall operation of and interaction with the CPU. Moreover, these dedicated logic circuits must be small in size so as to minimize the overall size of the CPU.

Traditionally, "static" logic gates have been utilized to construct logic circuits for performing mathematical operations. Static logic gates are those which can continuously perform logic operations so long as electrical power is available. In other words, static logic gates need no electrical precharge, or refresh, in order to properly perform logic operations. Static logic gates are functionally complete. They can directly perform both inverting and non-inverting functions. Further, they can be chained together in several stages to collectively perform logic functions. However, static logic gates are undesirably slow individually and, when chained together to collectively perform a logic function, are even slower.

Furthermore, "dynamic" logic gates are known in the art. Dynamic logic gates are used in the conventional design of logic circuits which require high performance and modest size. Dynamic logic gates are those which require a periodic electrical precharge, or refresh, such as with a dynamic random access memory (DRAM), in order to maintain and properly perform its intended logic function. Once an electrical precharge supplied to a dynamic logic gate has been discharged by the dynamic logic gate, the dynamic logic gate can no longer perform another logic function until subsequently precharged.

However, the use of conventional dynamic logic circuits in the construction of logic networks is problematic. They suffer from functional incompleteness. In other words, only non-inverting logic functions can be performed with the conventional dynamic logic gates. Moreover, high performance adder logic circuits and multiplier logic circuits invariably require logic inversions. Consequently, adder logic circuits and multiplier logic circuits cannot be built from conventional dynamic logic gates.

Furthermore, in many instances, conventional dynamic logic gates cannot be directly connected together as successive stages to collectively perform logic functions and still maintain their proper dynamic nature. Specifically, problems in regard to "static hazards" arise. A static hazard is an inherent condition which occurs in combinational logic configurations as a result of propagation delays.

For example, consider a two-input exclusive OR gate in a conventional binary logic system when both inputs are high and then both concurrently turn low. From a computer programmer's perspective, the output of the exclusive OR gate should remain low before, during, and after the transition. In reality, one of the inputs will change just before the other. Consequently, the output of the exclusive OR gate will undesirably and suddenly bounce high then low during the transition time.

Static hazards usually do not pose a substantial problem in a chain of static logic circuits, because the static logic circuits can respond more than once so as to be in proper accord with the ultimate states of the logic inputs. However, in a chain of dynamic logic circuits having an odd number of inversions in a logic path, static hazards will result in logic errors because the dynamic logic circuits, once triggered, cannot further respond until subsequently precharged. Hence, dynamic logic circuits cannot effectively be connected together in stages to derive some logic gates and still maintain their dynamic nature because they cannot recover from inherent static hazards.

SUMMARY OF THE INVENTION

The present invention is a system and method for implementing a new family of extremely fast logic gates in a computer system. The novel logic gates are called "mousetrap logic gates."

The methodology of the present invention envisions allocating logic paths for encoding "vector logic states" in the computer system. The vector logic states are defined and specified in the computer system by collectively conceptualizing the individual logic states on the logic paths. The individual logic states are referred to as "vector components."

Specifically, in accordance with the inventive methodology, an "invalid" vector logic state is defined as the case when all vector components are at a logic low ("0"; a low electrical signal level). Moreover, each of the "valid" vector logic states can be specified via a variety of schemes. For example, in one scheme, each valid vector logic state is defined as the case when one and only one of the vector components of a vector logic state exhibits a logic high ("1"; a high electrical signal level). Encoding of vector logic states could be handled by defining a valid vector logic state by more than one logic path, while still defining an invalid vector logic state when all logic paths exhibit a logic low.

Architecturally, the present invention envisions aggregating, in electrical series and/or parallel, a plurality of mousetrap gates for performing a variety of logic functions on vector logic states, for example, an AND function, an inclusive OR function, an exclusive OR function, and a carry propagate circuit. One or more vector inputs are operated upon to derive a vector output.

Each mousetrap gate comprises one or more parallel mousetrap gate components, which provide the logic state of each vector component of the vector output. Moreover, each mousetrap gate component comprises an arming mechanism, ladder logic, and a buffer mechanism.

The arming mechanism periodically energizes, or precharges, the buffer mechanism. As an analogy, the arming mechanism sets a kind of "mousetrap." The energization causes the buffer mechanism to maintain the vector component output of the gate component at a logic low until triggered by the ladder logic. When all gate components maintain their respective outputs at a logic low, then an invalid vector output is present.

The ladder logic of each gate component performs logic functions on one or more of the valid vector inputs (one and only one of the vector components of each vector input is at a logic high). The ladder logic of a gate component will trigger its buffer mechanism only if mandated by the result of the logic functions.

The buffer mechanism of a gate component maintains its corresponding vector component of the vector output at a logic low until and only if it is triggered by the ladder logic. If triggered, then the buffer mechanism provides its vector component at a logic high.

FEATURES AND ADVANTAGES OF THE INVENTION

The present invention overcomes the deficiencies of the prior art, as noted above, and further provides for the following additional advantages.

Generally, the mousetrap logic gates in accordance with the present invention offer a new, high performance, design option for computer architectural engineers and designers.

The vector logic of the present invention provides for an invalid logic state, as well as any number of valid logic states, unlike conventional logic systems. This feature permits self-timing and, thus, logic that avoids static hazards.

The number of vector logic gates which can be constructed from the family of mousetrap gates in accordance with the present invention is endless.

Mousetrap logic gates in accordance with the present invention can directly perform inverting and non-inverting functions, unlike conventional dynamic logic gates. As a result, high performance adder logic circuits and multiplier logic circuits which require many logic inversions can be easily constructed and implemented.

Mousetrap logic gates designed in accordance with the present invention are self-timed. Consequently, mousetrap logic stage will not generate a valid vector output until it has already received valid vector inputs. Furthermore, mousetrap logic gates can be connected together in successive stages to collectively perform logic functions without suffering from adverse reactions as a result of static hazards, which have traditionally caused adverse logic effects when interconnecting conventional dynamic logic gates.

The mousetrap gates of the present invention can be easily configured in a pipeline to perform pipeline logic operations.

Logic determinations in mousetrap logic gates are made from gate component to gate component as a monotonic progression. In other words, data is transferred from stage to stage of mousetrap logic gates by considering only the state transition from low to high, not from high to low, on any particular logic path. By knowing the direction of logic state transition, the specific hardware design of the switching components, such as MOSFETs, can be manipulated to maximize the speed in the monotonic direction, notwithstanding the detriment to the opposite direction.

For example, in specific implementations using MOSFETs, n-channel MOSFETs, rather than p-channel MOSFETs, may be utilized to perform all required logic functions in the critical path of data. The n-channel MOSFETs have superior drive capabilities, space requirements, and load specifications than the p-channel MOSFETs. Generally, an n-channel MOSFET switches approximately 50 percent faster than a comparable p-channel MOSFET.

Moreover, the inversion which must take place in the critical path can be accomplished by cleverly manipulating the design (gain) of a CMOSFET inverter, which comprises both a p-channel MOSFET pull-up and an n-channel MOSFET pull-down. Because of the known existence of a monotonic progression, the ratio of the n-channel MOSFET width to p-channel MOSFET width can be designed to favor switching in one direction, at the expense of the other direction. Specifically, in the present invention, the gate width of the p-channel MOSFET is made wider than the gate width of the n-channel MOSFET so that the CMOSFET inverter output switches very quickly from a logic low (the state when the mousetrap is armed) to a logic high. The speed of the CMOSFET switching from a logic low to a logic high does not matter because the mousetrap gate is precharged during this time period. Hence, the mousetrap logic gates can be constructed to exhibit superior performance and size specifications in one direction, to thereby tremendously increase the speed of data transfer and reduce the size specifications of the logic gate.

Because all logic gate components that perform logic functions in the critical logic path are of the same kind, the logic gate components can be shared to further minimize space.

Further advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawings.

DETAILED DESCRIPTION OF THE PREFERRED EMBODIMENTS

Typically, logic in a computer is encoded in binary fashion on a single logic path, which is oftentimes merely an electrical wire or semiconductor throughway. By definition, a high signal level, usually a voltage or current, indicates a high logic state (in programmer's language, a "1"). Moreover, a low signal level indicates a low logic state (in programmer's language, a "0"). The present invention envisions implementing "vector logic," where more than two valid logic states may be propagated through the logic gates in a computer.

Unlike conventional binary logic having two valid logic states (high, low) defined by one logic path, the vector logic of the preferred embodiment dedicates one logic path for each valid logic state. For example, in accordance with the preferred embodiment, in a vector logic system requiring two valid logic states, two logic paths are necessary. When both logic paths are at a logic low, an invalid logic state exists by definition. Moreover, a logic high existing exclusively on either of the two logic paths corresponds with the two valid logic states of the vector logic system. Finally, the scenario when both logic paths are high is an undefined logic state in the vector logic system. In a vector logic system requiring three logic states in accordance with the preferred embodiment, three logic paths would be needed, and so on. In conclusion, in accordance with the preferred embodiment, a vector logic system having n valid logic states and one invalid state comprises n logic paths.

It should be noted that other vector logic systems, aside from the vector logic system used in the preferred embodiment, but still in accord with the present invention, are envisioned. Specifically, encoding of vector logic states could be handled by defining a valid vector logic state by a logic high on more than one logic path, while still defining an invalid state when all paths exhibit a low logic signal. In other words, the vector logic states are not mutually exclusive.

For example, in a vector logic system using a pair of logic highs to define each valid vector logic state, the following logic scheme could be implemented. With three logic paths, "0,1,1" could designate a vector logic state 1, "1,0,1" a vector logic state 2, and "1,1,0" a vector logic state 3. With four logic paths, six valid vector logic states could be specified. With five logic paths ten valid vector logic states could be specified, and so on.

As another example, a vector logic system could be derived in accordance with the present invention wherein three logic highs define each valid vector logic state. Specifically, with four logic paths, "0,1,1,1" could designate a vector logic state 1, "1,1,1,0" a vector logic state 2, "1,1,0,1" a vector logic state 3, and "1,0,1,1" a vector logic state 4. With five logic paths, ten valid vector logic states could be specified, and so on.

Figure 1:
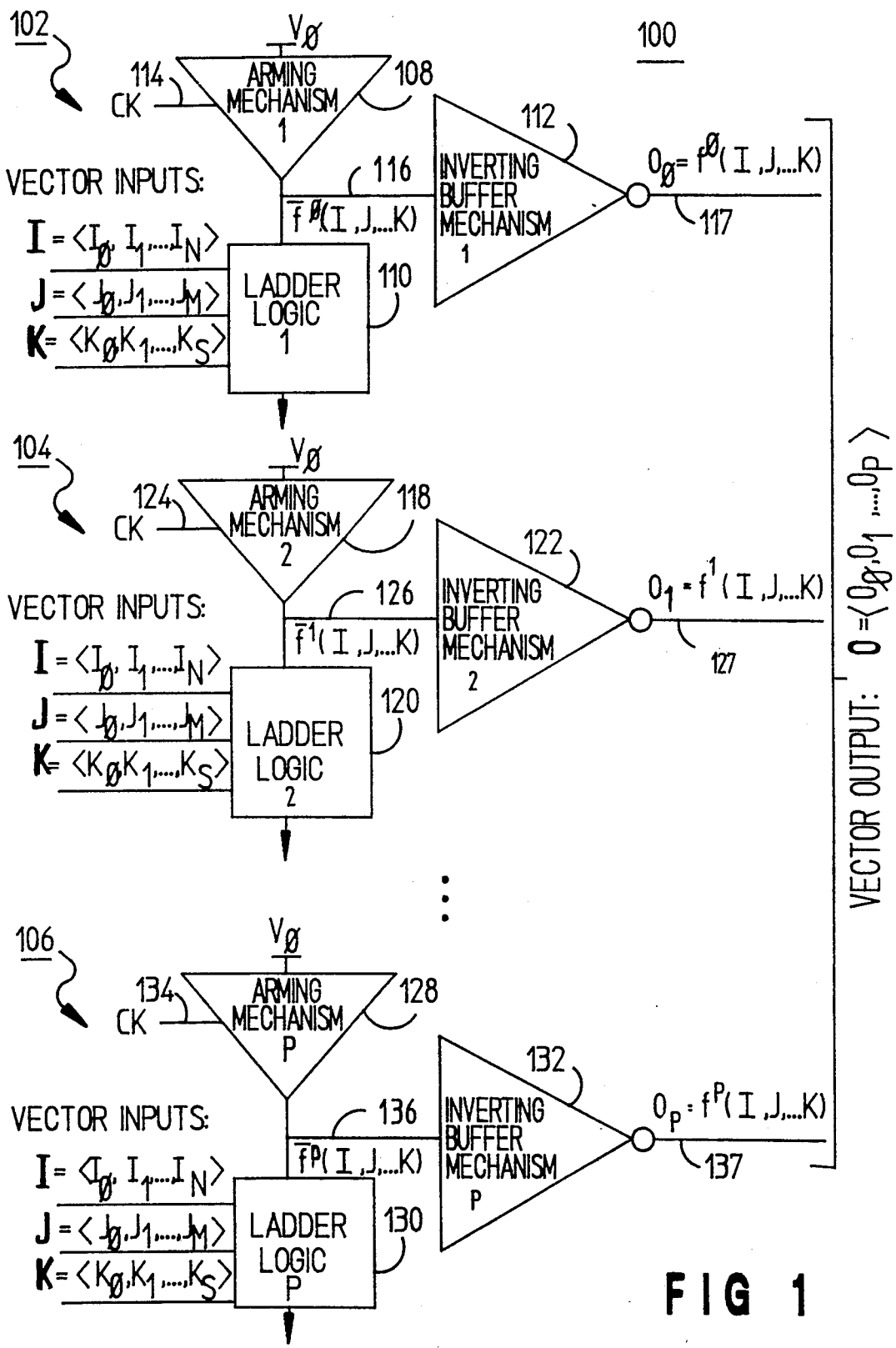
FIG. 1 illustrates a high level block diagram of a family of mousetrap logic gates in accordance with the present invention.

FIG. 1 illustrates a high level block diagram of a family of "mousetrap" logic gates in accordance with the present invention. Mousetrap logic gates, described in detail hereinafter, can implement vector logic at high speed, are functionally complete, are self-timed, and do not suffer adverse logic reactions resulting from static hazards when chained in a sequence of stages.

As shown in FIG. 1, each input to the mousetrap logic gate 100 of the present invention is a vector, denoted by vector inputs I, J, ..., K (hereinafter, vectors variables are in bold print). No limit exists as to the number of vector inputs I, J, ..., K. Further, each of vector inputs I, J, ..., K may be specified by any number of vector components, each vector component having a dedicated logic path denoted respectively in FIG. 1 by $I_0$–$I_N$, $J_0$–$J_M$, and $K_0$–$K_S$.

Essentially, each vector input specifies a vector logic state. As mentioned previously, an invalid vector logic state for any of the input vectors I, J, ..., K is present by definition when all of its corresponding vector components, respectively, $I_0$–$I_N$, $J_0$–$J_M$, and $K_0$–$K_S$, are at a logic low.

The output of the generic mousetrap logic gate 100 is also a vector, denoted by a vector output O. The vector output O is comprised of vector components $O_0$–$O_P$. The vector components $O_0$–$O_P$ are mutually exclusive and are independent functions of the vector inputs I, J, ..., K. Further, the vector components $O_0$–$O_P$ have dedicated mousetrap gate components 102–106, respectively, within the mousetrap logic gate 100. By definition in the present invention, one and only one of $O_0$–$O_P$ is at a logic high at a any particular time.

Moreover, no limit exists in regard to the number of vector components $O_0$–$O_P$ which can be associated with the output vector O. The number of vector components $O_0$–$O_P$ and thus mousetrap gate components 102–106 depends upon the logic function to be performed on the vector inputs individually or as a whole, the number of desired vector output components, as well as other considerations with respect to the logical purpose of the mousetrap logic gate 100.

As further indicated in FIG. 1, each mousetrap gate component 102–106 of the mousetrap logic gate 100 comprises an arming mechanism 108, ladder logic 110, and an inverting buffer mechanism 112. The arming mechanism 108 is a precharging means, or energizing means, for arming and resetting the mousetrap logic gate 100.

The arming mechanism 108 essentially serves as a switch to thereby selectively impose a voltage $V_0$ defining a logic state on a line 116 upon excitation by a clock signal (high or low) on line 114. As known in the art, any type of switching element or buffer for selectively applying voltage based upon a clock signal can be used. Furthermore, when the logic of a computer system is based upon current levels, rather than voltage levels, then the arming mechanism 108 could be a switchable current source, which is also well known in the art. Any embodiment serving the described switching function as the arming mechanism 108 is intended to be incorporated herein.

The ladder logic 110 is designed to perform a logic function on the vector inputs I, J, ..., K. The ladder logic 110 corresponding to each mousetrap gate component 102–106 may vary depending upon the purpose of each mousetrap gate component 102–106. In the preferred embodiment, the ladder logic 110 is essentially a combination of simple logic gates, for example, logic OR gates and/or logic AND gates, which are connected in series and/or in parallel. It should be noted that the ladder logic 110 is configured in the present invention so that one and only one of the vector output components O0–OP is at a logic high at any sampling of a valid vector output O. Specific implementations of the ladder logic 110 are described below in regard to the illustrations of FIGS. 2–5.

The ladder logic 110 must operate at high speed because it resides in the critical logic path, unlike the arming mechanism 108 which initially acts by arming the mousetrap gate component, but then sits temporarily dormant while data actually flows through the mousetrap gate component, i.e., through the critical logic path. Furthermore, because the ladder logic 110 resides in the critical logic path which is essentially where the logical intelligence is positioned, a plurality of logic gates are generally required to implement the desired logic functions.

Also residing in the critical logic path is the inverting buffer mechanism 112. The inverting buffer mechanism 112 primarily serves an inverter because in order to provide complete logic functionality in the mousetrap gate 100, it is necessary to have an inversion function in the critical logic path. Moreover, the inverting buffer mechanism 112 provides gain to the signal residing on line 114 and provides isolation between other potential stages of mousetrap gate components similar to the mousetrap logic gate components 102–106 of FIG. 1. The inverting buffer mechanism 112 is characterized by a high input impedance and low output impedance. Any buffer embodiment serving the described function as the buffer mechanism 112 is intended to be incorporated herein.

Furthermore, worth noting is that the arming mechanism 108, the ladder logic 110, and the inverting buffer mechanism 112 could in some implementations all reside on a single integrated circuit (IC), for example, an application specific integrated circuit (ASIC) or microprocessor chip.

The operation of the mousetrap logic gate 100 is described below at a high conceptual level in regard to only the mousetrap gate component 102 for simplicity. The narrowing of the present discussion is well grounded, because the various mousetrap gate components 102–106 are essentially redundant with the exception of their corresponding ladder logic functions implemented by ladder logics 110, 120, and 130. Consequently, the following discussion is equally applicable to the remaining mousetrap gate components 104 and 106.

In operation, upon excitation by a clock CK on the line 114, the arming mechanism 108 pulls up, or drives, the output 116 of the ladder logic 110 to a logic high. Concurrently, the arming mechanism 108 pulls the input at line 114 to the inverting buffer mechanism 112 to a logic high. Consequently, the corresponding vector component $O_0$ on a line 117 is maintained at a logic low, defined in the present invention as an invalid state. In the foregoing initial condition, the mousetrap logic gate 100 can be analogized as a "mousetrap," in the traditional sense of the word, which has been set and which is waiting to be triggered by the vector inputs I, J, . . . , K.

The mousetrap logic gate 100 will remain in the armed predicament with the vector component $O_0$ in the invalid state, until being triggered by the ladder logic 110. The mousetrap logic gate 100 is triggered upon receiving enough valid vector inputs I, J, . . . , K to definitively determine the correct state of the vector component $O_0$ on the line 117. In some designs of the ladder logic 110, not all of the vector inputs will need to be considered in order to produce an output signal on line 116, and hence, on line 117. The number of vector inputs I, J, . . . , K needed to make the definitive determination of the output state and also the timing of the determination is defined by the content and configuration of the simple logic gates within the ladder logic 110.

After the vector component $O_0$ on line 117 is derived, it is passed onto the next stage (not shown) of logic. The mousetrap logic gate component 102 will not perform any further function until being reset, or re-armed, or refreshed, by the arming mechanism 108. In a sense, the timing from mousetrap gate component to mousetrap gate component as well as gate to gate depends upon the encoded data itself. In other words, the mousetrap gate components are "self-timed."

Mousetrap logic gates in accordance with the present invention directly perform inverting and non-inverting functions. Consequently, in contrast to conventional dynamic logic gates, mousetrap logic gates can perform multiplication and addition, which require logic inversions, at extremely high speeds.

Finally, it should be noted that the family of mousetrap logic gates 100 can be connected in electrical series to derive a combinational logic gate which will perform logic functions as a whole. Thus, a mousetrap gate component, comprising an arming mechanism, ladder logic, and an inverting buffer mechanism, can be conceptualized as the smallest subpart of a mousetrap logic gate. Moreover, various mousetrap gate components can be connected in series and/or in parallel to derive a multitude of logic gates.

However, when mousetrap logic gates are chained together in long chains (perhaps, greater than two or three mousetrap gate components in series), precharging of the chains might require an undesirable lengthy amount of time. The reason is that mousetrap gate components will not be able to pull their output low (invalid) until their input is pulled low. The result is that the mousetrap gate components will charge in sequence from the first to the last in the chain, thereby undesirably slowing the precharge of the overall chain. Hence, a way is needed to cause the mousetrap gate components of a chain to precharge in parallel, not in sequence.

Figure 1A:
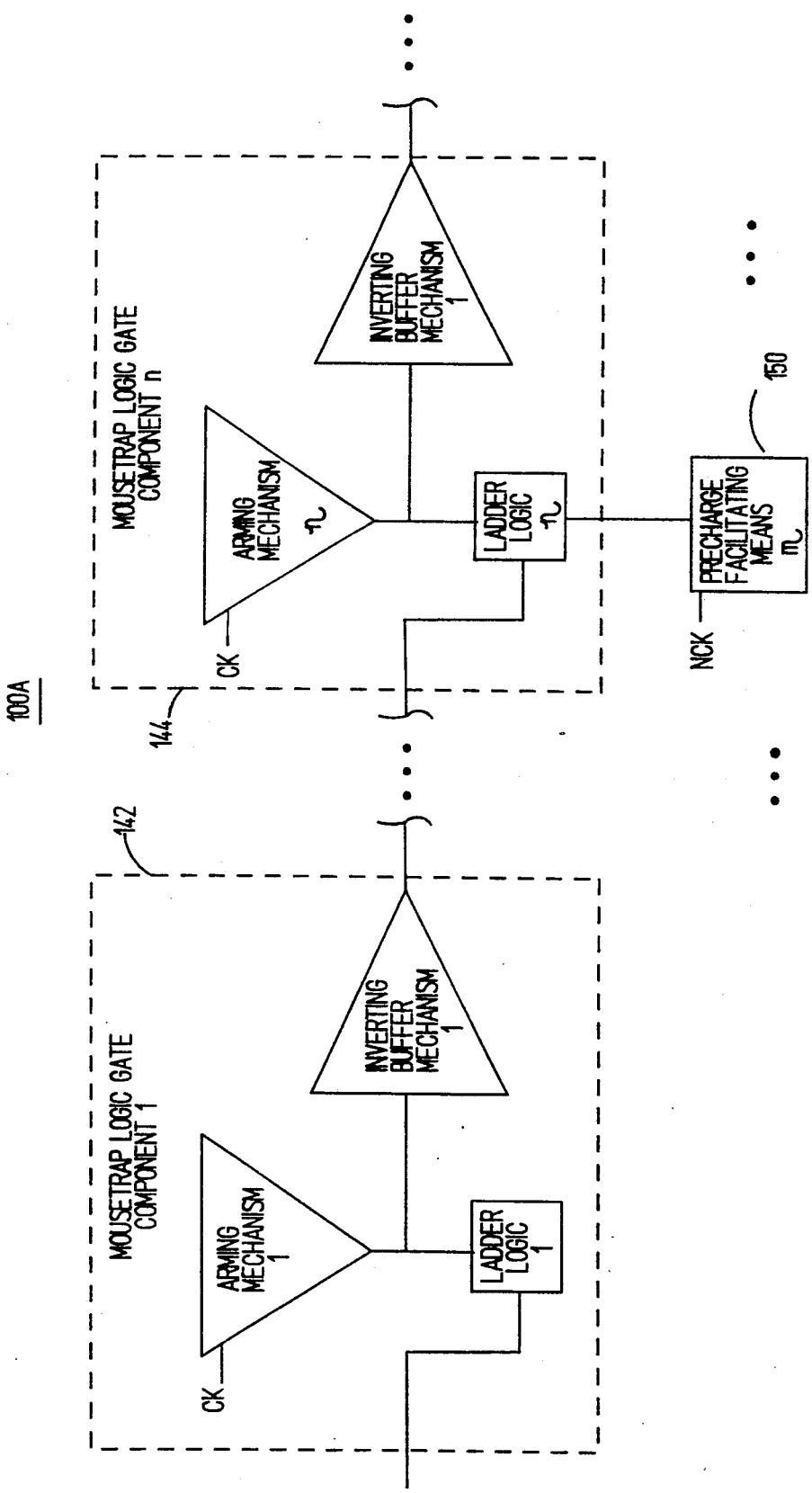
FIG. 1A illustrates a high level block diagram of a precharge facilitating means for providing parallel precharging in the family of mousetrap logic gates of FIG. 1.

Parallel precharging can be accomplished several different ways via a precharge facilitating means 150, which is described hereafter relative to FIGS. 1 and 1A. A preferred precharge facilitating means 150 in a clock triggered n-channel MOSFET provided to disable the ladder logics 110, 120, and 130 of FIG. 1 during the precharging of the mousetrap gate components. In other words, a push-pull situation is implemented. The arming mechanism of a mousetrap gate component pulls (precharges) the input to the inverting buffer mechanism high, while the inserted n-channel MOSFET pulls the ladder logic low.

It should be noted that the n-channel MOSFET slightly slows the operation of the mousetrap gate component. However, it should be emphasized that the n-channel MOSFET need not be implemented for every mousetrap gate component. It need only be inserted every second or third mousetrap gate component in series. Moreover, in certain logic circuits, such as multiplication, the parallelism of the logic operation may be exploited to reduce the number of requisite n-channel MOSFETs. Thus, as indicated in FIG. 1A, in a series of n cascaded mousetrap logic gates 142, 144, only a smaller number m of precharge facilitating means 150 need be implemented to effectuate parallel precharging of the gates 142, 144. Said another way, the ratio of m to n can be less than one to one. The foregoing embodiment for providing parallel precharging has advantages. It requires little additional power dissipation. Moreover, it can, if desired, be uniformly applied to all mousetrap gate components for simplicity.

Another preferred precharge facilitating means 150 for providing for parallel precharging of mousetrap gate components chained in series is a mousetrap AND gate periodically in the critical logic path. The mousetrap AND gate is inputted (1) an output vector component from a preceding mousetrap gate component and (2) the precharge clock. The output of the mousetrap AND gate is inputted to the next in series mousetrap gate component.

Figure 2:
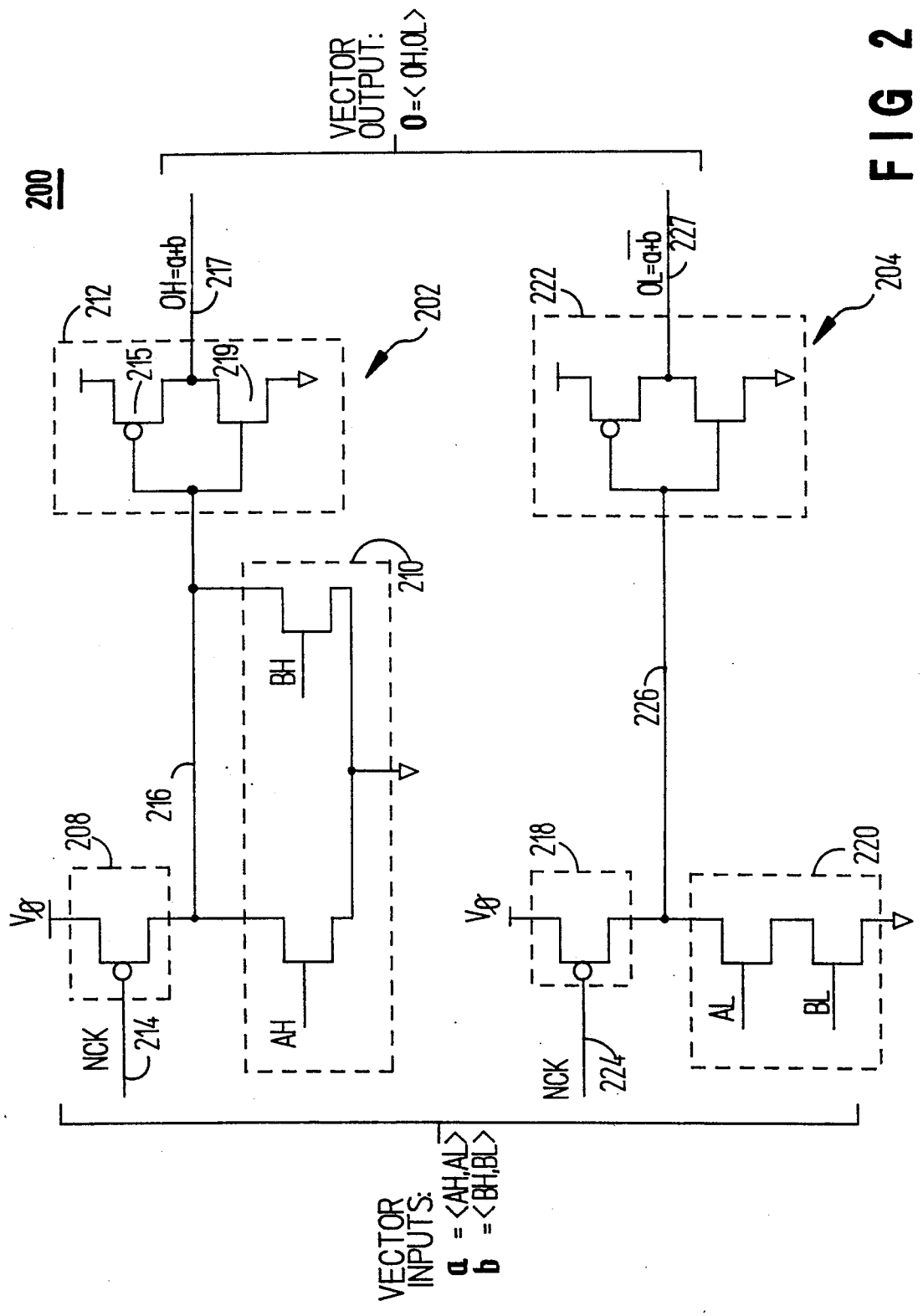
FIG. 2 illustrates a low level block diagram of a two-input inclusive OR mousetrap logic gate, in accordance with the present invention of FIG. 1.

FIG. 2 shows a low level block diagram of an example of a two-input inclusive OR mousetrap logic gate 200 in accordance with the present invention of FIG. 1. The inclusive OR mousetrap logic gate 200 can be used in a vector logic system having two logic states and one invalid logic state.

As shown, the inclusive OR mousetrap logic gate 200 has two mousetrap gate components 202 and 204. The mousetrap gate component 202 comprises an arming mechanism 208, ladder logic 210, and an inverting buffer mechanism 212. The mousetrap gate component 204 comprises an arming mechanism 218, ladder logic 220, and an inverting buffer mechanism 222. Note the similarity of reference numerals with regard to FIG. 1, as well as with the other figures to follow.

The inclusive OR mousetrap logic gate 200 and specifically, the arming mechanisms 208 and 218, is armed by command of a clock NCK ("N" denotes active at logic low) on respective lines 214 and 224. In the preferred embodiments of the present invention, the arming mechanisms 208 and 218 are p-channel metal-oxide-semiconductor field-effect transistors (MOSFET), as shown in FIG. 2, which are well known in the art and are commercially available. N-channel MOSFETs could be used instead of p-channel MOSFETs; however, the clocking obviously would be diametrically opposite.

With reference to FIG. 2, the MOSFETs comprising the arming mechanisms 208 and 218 essentially serve as switches to thereby impose a voltage VO on respective lines 216 and 226 upon excitation by a low clock NCK signal on respective lines 214 and 224. As further known in the art, any type of switching element for voltage can be used.

Additionally, in the preferred embodiments, the simple logic in the ladder logics 210 and 220 is implemented with n-channel MOSFETs, as shown. The rationale for using n-channel MOSFETs is as follows. N-channel MOSFETs have superior drive capabilities, space requirements, and load specifications, than comparable p-channel MOSFETs. A typical n-channel MOSFET can generally switch approximately 50 percent faster than a comparable p-channel MOSFET having similar specifications.

Furthermore, in the preferred embodiments, the inverting buffer mechanisms 212 and 222 are static CMOSFET inverter, as shown in FIG. 2, which are well known in the art and are commercially available. A CMOSFET inverter is utilized for several reasons. As stated previously, an inversion must take place in the critical logic path in order to provide functional completeness. The inversion which must take place in the critical path can be accomplished by cleverly manipulating the design (gain) of a conventional CMOSFET inverter, which comprises both a p-channel MOSFET pull-up 215 and an n-channel MOSFET pull-down 219. In other words, because of the known existence of a monotonic progression, the ratio of the n-channel MOSFET width to p-channel MOSFET width can be designed to favor switching in one direction [i.e., either high (1) to low (0) or low (0) to high(1)], at the expense of the other direction.

Specifically, in the particular CMOSFET inverter envisioned by the present invention, the gate width of the constituent p-channel MOSFET 215 is made wider than the gate width of the constituent n-channel MOSFET 219. Consequently, the CMOSFET inverter output switches very quickly from a logic low (0; the armed state of the mousetrap) to a logic high (1; the unarmed state of the mousetrap). The speed of the CMOSFET inverter output switching from a logic high to a logic low does not matter because the mousetrap gate 200 is precharged during this time period. Hence, the mousetrap logic gate 200 can be constructed to exhibit superior performance and size specifications in one direction, to thereby tremendously increase the speed of data transfer and reduce the size specifications of the mousetrap logic gate 200. With respect to operation, a truth table for the inclusive OR mousetrap logic gate 200 is set forth in Table A hereinafter.

TABLE A

| a | b | O | AH | AL | BH | BL | OH | OL |
|---|---|---|----|----|----|----|----|----|
| inv | x | inv | 0 | 0 | x | x | 0 | 0 |
| x | inv | inv | x | x | 0 | 0 | 0 | 0 |
| 0 | 0 | 0 | 0 | 1 | 0 | 1 | 0 | 1 |
| 0 | 1 | 1 | 0 | 1 | 1 | 0 | 1 | 0 |
| 1 | 0 | 1 | 1 | 0 | 0 | 1 | 1 | 0 |
| 1 | 1 | 1 | 1 | 0 | 1 | 0 | 1 | 0 |

In the above Table A, "x" denotes a an irrelevant or "don't care" situation; "inv" denotes an invalid logic state; "1" denotes a high logic state; and "0" denotes a low logic state.

As indicated in Table A and shown in FIG. 2, a vector input a and a vector input b are operated upon by the inclusive OR mousetrap logic gate 200 to derive a vector output O. For discussion purposes, it is worth noting that vector input a, vector input b, and vector output O could correspond respectively with vector input I, vector input J, and vector output O of FIG. 1.

Vector input a specifies a vector logic state defined by two vector components AH and AL. Vector input b specifies a vector logic state defined by two other vector components BH and BL. Vector output O specifies a vector logic state defined by two vector components OH and OL, which collectively describe the inclusive disjunction (OR function) of vector inputs a and b. In vector notation, as shown, a=<AH,AL>; b=<BH,BL>; and O=<OH,OL>=a+b.

Figure 3:
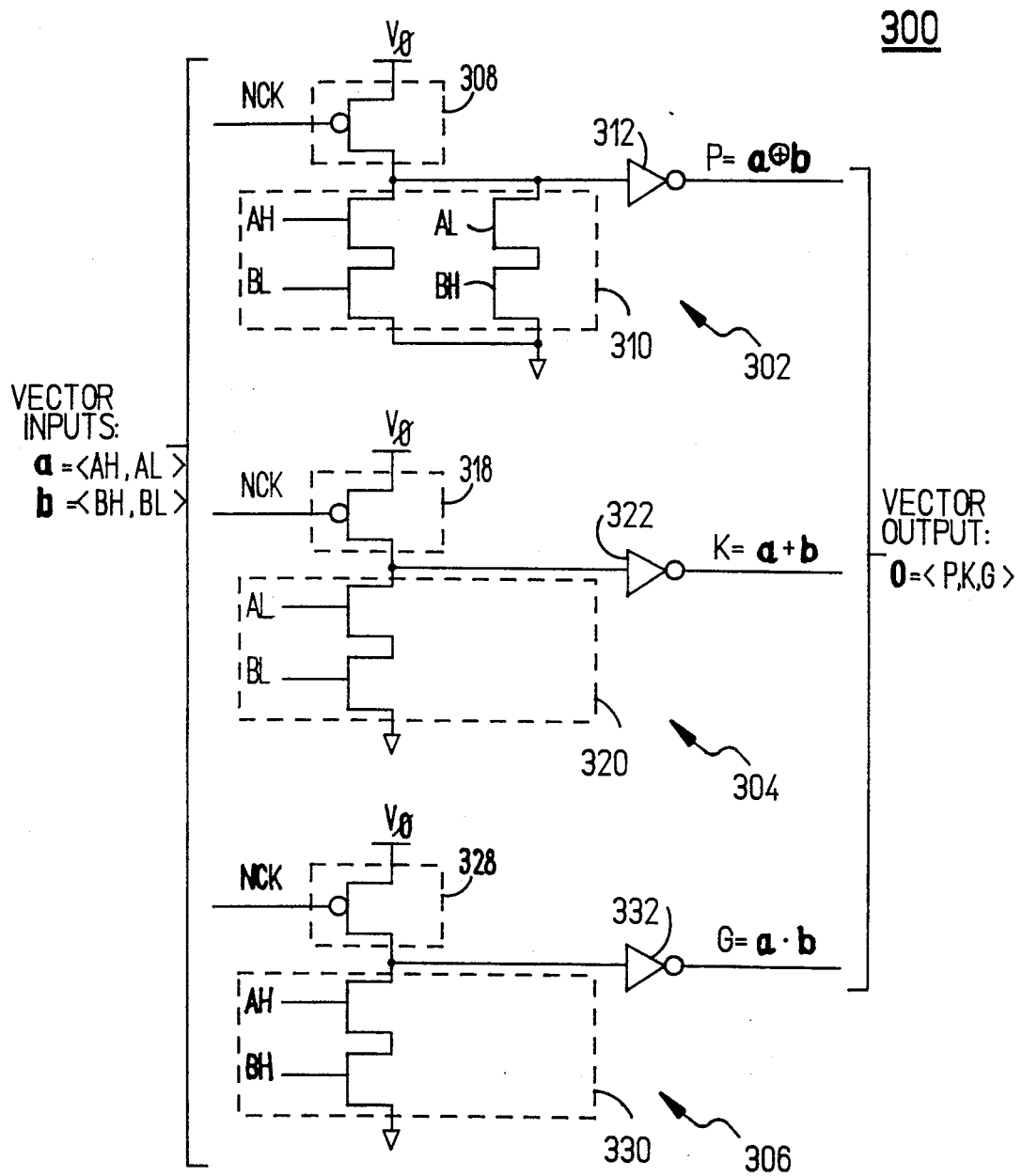
FIG. 3 illustrates a low level block diagram of a two-input add predecoder logic gate, in accordance with the present invention of FIG. 1.

FIG. 3 shows a low level block diagram of a two-input add predecoder logic gate 300 in accordance with the present invention of FIG. 1. Well known in the art, a predecoder is logic primarily used in the arithmetic logic unit (ALU) to perform arithmetic functions, especially addition. Generally, a predecoder aids in parallel processing and facilitates control of a carry bit path.

As shown, the predecoder 300 has three mousetrap gate components 302–306. Respectively, the three mousetrap gates 302–306 comprise the following: (1) an arming mechanism 308, ladder logic 310, and a buffer 312; (2) an arming mechanism 318, ladder logic 320, and a buffer 322; and (3) an arming mechanism 328, ladder logic 330, and a buffer 332.

A truth table describing the operation of the add predecoder logic gate 300 is set forth in Table B hereinafter.

TABLE B

| a | b | O | AH | AL | BH | BL | P | K | G |
|---|---|---|---|---|---|---|---|---|---|
| inv | x | inv | 0 | 0 | x | x | 0 | 0 | 0 |
| x | inv | inv | x | x | 0 | 0 | 0 | 0 | 0 |
| 0 | 0 | kill | 0 | 1 | 0 | 1 | 0 | 1 | 0 |
| 0 | 1 | prop | 0 | 1 | 1 | 0 | 1 | 0 | 0 |
| 1 | 0 | prop | 1 | 0 | 0 | 1 | 1 | 0 | 0 |
| 1 | 1 | gen | 1 | 0 | 1 | 0 | 0 | 0 | 1 |

Similar to the inclusive OR mousetrap logic gate 200 of FIG. 2, vector input a specifies a vector logic state defined by two vector components AH and AL. Vector input b specifies a vector logic state defined by two other vector components BH and BL. However, in contrast to the mousetrap logic gate of FIG. 2, vector output O specifies a vector logic state defined by three vector components P, K, and G, discussed in detail below. In vector notation, as shown, a = <AH,AL>; b = <BH,BL>; and O = <P,K,G>.

Conventional predecoders are usually designed so that the output indicates only one of two logic states. In many implementations, the conventional predecoder indicates either that the carry should be "propagated" (designated by "P") or that the carry bit should be "killed" (designated by "K"). In other implementations, the predecoder indicates either that the carry should be "propagated" or that the carry bit should be "generated" (designated by "G").

In the present invention, as noted in Table B, the vector output o can indicate any of four logic states: an invalid state and three valid states, namely, kill, propagate, or generate.

Furthermore, the add predecoder logic gate 300 must perform an exclusive OR function as part of the overall predecoder function. Conventionally, dynamic logic gates could not implement the exclusive OR function because static hazards would cause logic errors. Static hazards occur in combinational logic configurations because of propagation delays. The mousetrap logic gates of the present invention are not adversely affected by static hazards, because of self-timing. No valid vector component output is present unless all the vector inputs, needed to definitively determine the output of the ladder logic, are valid as indicated in Table B.

Figure 4:
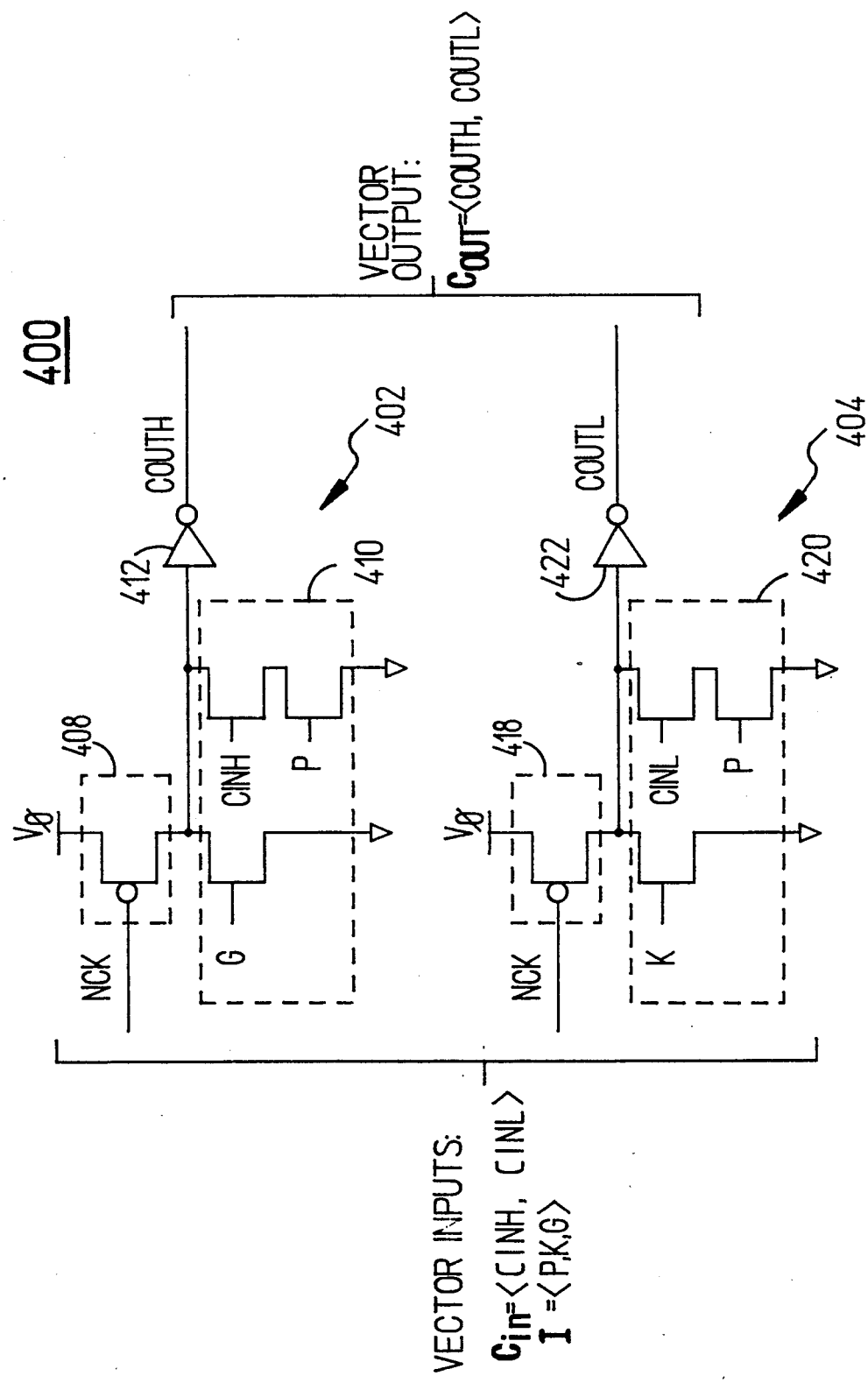
FIG. 4 illustrates a low level block diagram of a carry propagate logic gate in accordance with the present invention capable of use in series with the add predecoder logic gate of FIG. 3.

FIG. 4 shows a low level block diagram of a carry propagate gate 400 in accordance with the present invention. Well known in the art, a carry propagate logic gate is oftentimes used in series with an add predecoder logic gate, as discussed previously, in order to control a carry bit path in an ALU. Specifically, the carry propagate gate 400 functions in series with the add predecoder logic gate 300 in the preferred embodiment to provide a high performance carry bit path.

The carry propagate gate 400 has two mousetrap gate components 402 and 404. The mousetrap gate component 402 comprises an arming mechanism 408, ladder logic 410, and an inverting buffer mechanism 412. The mousetrap gate component 404 comprises an arming mechanism 418, ladder logic 420, and an inverting buffer mechanism 422.

To further clarify the functionality of the carry propagate gate 400, a truth table for the carry propagate gate 400 is set forth in Table C hereinafter.

TABLE C

| I | CIN | COUT | P | K | G | CINH | CINL | COUTH | COUTL |
|---|---|---|---|---|---|---|---|---|---|
| inv | x | inv | 0 | 0 | 0 | x | x | 0 | 0 |
| x | inv | inv | x | x | x | 0 | 0 | 0 | 0 |
| kill | x | 0 | 0 | 1 | 0 | x | x | 0 | 1 |
| prop | 0 | 0 | 1 | 0 | 0 | 0 | 1 | 0 | 1 |
| prop | 1 | 1 | 1 | 0 | 0 | 1 | 0 | 1 | 0 |
| gen | x | 1 | 0 | 0 | 1 | x | x | 1 | 0 |

Figure 5:
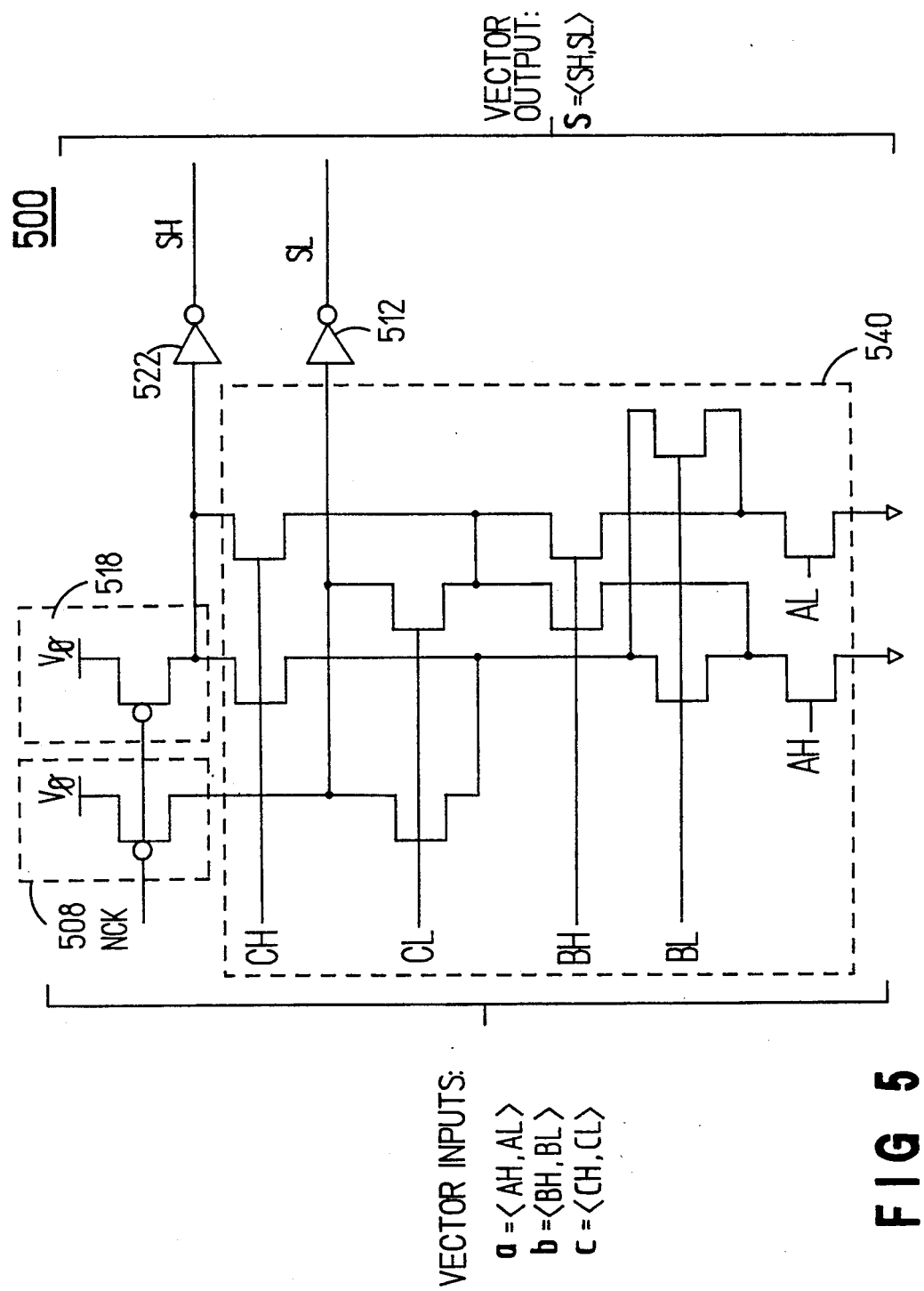
FIG. 5 illustrates a low level block diagram of a three-input exclusive OR mousetrap logic gate in accordance with the present invention, wherein the exclusive OR mousetrap logic gate can be used for sum generation in a full adder and does not suffer adverse logic effects from static hazards.

FIG. 5 shows a low level block diagram of a three-input exclusive OR mousetrap logic gate 500 in accordance with the present invention. The exclusive OR mousetrap logic gate 500 can be used for high speed sum generation in either a full or half adder and does not suffer from any adverse effects from static hazards. Sum generation logic gates are well known in the art. They are especially useful in adder and multiplier logic circuits.

The exclusive OR logic gate 500 has two mousetrap gate components 502 and 504, having respective arming mechanisms 508 and 518 as well as inverting buffer mechanisms 512 and 522. However, as shown by a phantom block 540, the ladder logic associated with each of the two mousetrap gate components 502 and 504 is not separated completely in hardware, but remains mutually exclusive in a logic sense. Hence, as a general proposition, because the ladder logic in each mousetrap gate component of a mousetrap logic gate uses the same type of gates, namely, n-channel MOSFETs, sometimes their logic functions can share the same hardware, thereby resulting in a less number of total gates and a reduction in utilized computer real estate.

A truth table indicating the operation of the exclusive OR logic gate 500 is set forth in Table D hereinafter.

TABLE D

| a | b | c | s | AH | AL | BH | BL | CH | CL | SH | SL |
|---|---|---|---|---|---|---|---|---|---|---|---|
| inv | x | x | inv | 0 | 0 | x | x | x | x | 0 | 0 |
| x | inv | x | inv | x | x | 0 | 0 | x | x | 0 | 0 |
| x | x | inv | inv | x | x | x | x | 0 | 0 | 0 | 0 |
| 0 | 0 | 0 | 0 | 0 | 1 | 0 | 1 | 0 | 1 | 0 | 1 |
| 0 | 0 | 1 | 1 | 0 | 1 | 0 | 1 | 1 | 0 | 1 | 0 |
| 0 | 1 | 0 | 1 | 0 | 1 | 1 | 0 | 0 | 1 | 1 | 0 |
| 0 | 1 | 1 | 0 | 0 | 1 | 1 | 0 | 1 | 0 | 0 | 1 |

TABLE D-continued

| a | b | c | s | AH | AL | BH | BL | CH | CL | SH | SL |
|---|---|---|---|----|----|----|----|----|----|----|----|
| 1 | 0 | 0 | 1 | 1 | 0 | 0 | 1 | 0 | 1 | 1 | 0 |
| 1 | 0 | 1 | 0 | 1 | 0 | 0 | 1 | 1 | 0 | 0 | 1 |
| 1 | 1 | 0 | 0 | 1 | 0 | 1 | 0 | 0 | 1 | 0 | 1 |
| 1 | 1 | 1 | 1 | 1 | 0 | 1 | 0 | 1 | 0 | 1 | 0 |

As indicated in Table E and shown in FIG. 5, vector input a specifies a vector logic state defined by two vector components AH and AL. Vector input b specifies a vector logic state defined by two other vector components BH and BL. Vector input c specifies a vector logic defined by two vector components CH and CL. Furthermore, vector output s specifies a vector logic state defined by two outputs SH and SL. In vector notation, as shown, a=<AH,AL>; b=<BH,BL>; c=<CH,CL>; and s=<SH,SL>.

The foregoing description of the preferred embodiment of the present invention has been presented for the mere purposes of illustration and description. It is not intended to be exhaustive or to limit the present invention to the precise form disclosed, and obviously many modifications and variations are possible in light of the above teachings The particular preferred embodiments were chosen and described in order to best explain the principles of the present invention and its practical application to those persons skilled in the art and to thereby enable those persons skilled in the art to best utilize the present invention in various embodiments and with various modifications as are suited to the particular use contemplated. It is intended that the scope of the present invention be broadly defined by the claims.

I claim the following:

1. A logic gate for use in a logic system having a plurality of vector logic states wherein one and only one vector logic state is defined valid by a high logic state on a predetermined exclusive set of one or more logic paths and wherein an invalid vector logic state is defined when all said logic paths exhibit a low logic state, the logic gate comprising:
   logic corresponding to each of said logic paths, said logic for recognizing a logic gate input on said logic paths;
   an inverting buffer connected to each said logic, said inverting buffer for providing a logic gate output, said logic gate output triggered from a low logic state to a high logic state by said logic, said inverting buffer comprising a static CMOSFET inverter having a p-channel MOSFET and an n-channel MOSFET, said p-channel MOSFET having a wider gate than said n-channel MOSFET; and
   an arming mechanism adapted to periodically precharge the input of said inverting buffer to thereby cause said inverting buffer to maintain said buffer output at a low logic state until triggered by said logic.

2. The logic gate of claim 1, wherein said logic comprises one or more MOSFETs.

3. The logic gate of claim 1, wherein said arming mechanism comprises a transistor configured to switch either a voltage source or a current source for generating a precharge signal.

4. The logic gate of claim 1, further comprising a second logic gate substantially identical in structure to said logic gate and cascaded with said logic gate, said logic gate and said second logic gate adapted to consecutively perform logic functions upon said input vector and collectively provide said output vector, said logic gate and said second logic gate being self-timed.

5. The logic gate of claim 1, wherein a logic high on at least two of said logic paths defines each of said valid vector logic states.

6. A logic gate for use in a logic system having a plurality of vector logic states wherein one and only one vector logic state is defined valid by a high logic state on a predetermined exclusive set of one or more logic paths and wherein an invalid vector logic state is defined where all said logic paths exhibit a low logic state, the logic gate comprising:
   logic means for receiving vector inputs, for performing logic functions upon said vector inputs, and for providing a first vector output;
   buffer means for receiving said first vector output, for maintaining a second vector output of said logic gate at said invalid state before receiving said first vector output, and for providing said second vector output in a valid vector logic state after receiving said first vector output, said buffer means comprising a static CMOSFET inverter having a p-channel MOSFET and an n-channel MOSFET, said p-channel MOSFET having a wider gate than said n-channel MOSFET; and
   arming means for periodically precharging said buffer means to maintain said second vector output at said invalid state.

7. The logic gate of claim 6, wherein said logic comprises n-channel MOSFETs.

8. The logic gate of claim 6, further comprising a second logic gate substantially identical in structure to said logic gate and cascaded with said logic gate, said logic gate and said second logic gate adapted to consecutively perform logic functions upon said vector logic input and collectively providing said vector logic output, said logic gate and said second logic gate being self-timed.

9. The logic gate of claim 6, wherein said logic gate performs a carry propagate function in an adder.

10. The logic gate of claim 6, wherein said logic gate performs an inclusive OR logic function on two vector inputs.

11. The logic gate of claim 6, wherein said second vector output is defined by greater than two logic paths.

12. The logic gate of claim 6, wherein a logic high on at least two of said logic paths defines each of said valid vector logic states.

13. A self-timed dynamic logic system comprising:
   a plurality of cascaded logic gates, each of said cascaded logic gates having logic for recognizing logic gate inputs on a plurality of logic paths, an inverting buffer connected to said logic, said inverting buffer for providing a logic gate output, said logic gate output triggered from a low logic state to a high logic state by said logic, and an arming mechanism adapted to periodically precharge the input of said inverting buffer to thereby cause said inverting buffer to maintain said buffer output at a low logic state until triggered by said logic; and one and only one precharge facilitating means connected to the logic of a logic gate of said plurality, said precharge facilitating means for disabling said logic during said precharge and for promoting parallel precharging of said plurality of cascaded logic gates.

14. The system of claim 13, wherein said precharge facilitating means comprises a transistor configured to switch said logic to ground.

15. The system of claim 13, wherein said precharge facilitating means comprises an AND logic gate configured to switch said logic gate inputs of said logic to ground.

16. A self-timed dynamic logic system, comprising:

a plurality of cascaded logic gates, each of said cascaded logic gates having logic for recognizing logic inputs on a plurality of logic paths, an inverting buffer connected to said logic, said inverting buffer for providing a buffer output, said buffer output triggered from a low logic state to a high logic state by said logic, and an arming mechanism adapted to periodically precharge a buffer input of said inverting buffer to thereby cause said inverting buffer to maintain said buffer output at a low logic state until triggered by said logic; and a precharge facilitating means connected to said logic of a logic gate of said plurality, said precharge facilitating means for disabling said logic during said precharge and for promoting parallel precharging of said plurality of said cascaded logic gates, said precharge facilitating means comprising an AND logic gate configured to switch said logic gate inputs of said logic to ground.

17. A self-timed dynamic logic system, comprising:

n-cascaded logic gates, each of said n cascaded logic gates having logic for receiving logic inputs on a plurality of logic paths, an inverting buffer connected to said logic, said inverting buffer for providing a buffer output, said buffer output triggered from a low logic state to a high logic state by said logic, and an arming mechanism adapted to periodically precharge a buffer input of said inverting buffer to thereby cause said inverting buffer to maintain said buffer output at a low logic state until triggered by said logic;

m precharge facilitating means, each of said m precharge facilitating means connected to said logic of one of said n cascaded logic gates, said m precharge facilitating means for disabling said logics of said n cascaded logic gates during said precharge and for promoting parallel precharging of said n cascaded logic gates; and wherein the ratio of m to n is less than one to one.

18. The system of claim 17, wherein said precharge facilitating means comprises a transistor configured to switch said logic to ground.

19. The system of claim 17, wherein said precharge facilitating means comprises an AND logic gate configured to switch said logic inputs of said logic to ground.

20. A logic gate for a self-timed and monotonic logic system utilizing vector logic states, each of said vector logic states defined by any number of binary logic states situated respectively on a plurality of logic paths, each of said vector logic states encoding timing information by defining an invalid state when all said binary logic states concurrently exhibit a logic low and by defining one of a plurality of valid states when a preselected exclusive subset of said binary logic states exhibits a logic high, the logic gate for deriving a vector output from a plurality of vector inputs, comprising:

ladder logic means comprising a plurality of ladder logics, said ladder logic means for receiving said vector inputs, for performing logic functions upon said vector inputs, and for providing a ladder logic output from a ladder logic;

buffer means comprising a plurality of inverting buffers associated respectively with said ladder logics, said inverting buffers configured to output said binary logic states defining said vector output, said inverting buffers configured to maintain said binary logic states at a logic low before receiving said ladder logic output so that said vector output exhibits said invalid state, one of said inverting buffers configured to receive said ladder logic output and invert said ladder logic output to thereby derive said vector output in a valid state;

said buffer means comprising a static CMOSFET inverter having a p-channel MOSFET and an n-channel MOSFET, said p-channel MOSFET having a wider gate than said n-channel MOSFET; and arming means comprising a plurality of arming mechanisms associated respectively with said inverting buffers, said arming mechanisms configured to periodically precharge said buffer mechanisms respectively to thereby cause said buffer mechanisms to maintain said binary logic states at said logic low.

21. The logic gate of claim 20, wherein said ladder logic means comprises n-channel MOSFETS.

22. The logic gate of claim 20, wherein said arming means comprises a transistor configured to switch a voltage source for generating a precharge signal.

23. The logic gate of claim 20, wherein said arming means comprises a transistor configured to switch a current source for generating a precharge signal.

24. The logic gate of claim 20 residing on an integrated circuit.

25. The logic gate of claim 20, further comprising a second logic gate substantially identical in structure to said logic gate and cascaded with said logic gate, said logic gate and said second logic gate adapted to consecutively perform logic functions upon said vector inputs and collectively provide said second vector output, said logic gate and said second logic gate being self-timed.

26. The logic gate of claim 20, wherein said vector output is defined by binary logic states on greater than two logic paths.

27. The logic gate of claim 20, wherein a logic high on at least two of said logic paths defines each of said vector logic states when exhibiting said valid state.

* * * * *